(12) United States Patent
Daryanani et al.

(10) Patent No.: US 10,847,225 B2
(45) Date of Patent: Nov. 24, 2020

(54) SPLIT-GATE FLASH MEMORY CELL WITH IMPROVED READ PERFORMANCE

(71) Applicant: Microchip Technology Incorporated, Chandler, AZ (US)

(72) Inventors: Sonu Daryanani, Tempe, AZ (US); Matthew G. Martin, Gilbert, AZ (US); Gilles Festes, Fuveau (FR)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 162 days.

(21) Appl. No.: 16/013,631

(22) Filed: Jun. 20, 2018

(65) Prior Publication Data

US 2019/0392899 A1 Dec. 26, 2019

(51) Int. Cl.
*G11C 16/04* (2006.01)
*G11C 11/4074* (2006.01)
*G11C 11/56* (2006.01)
*H01L 27/11521* (2017.01)
*H01L 29/66* (2006.01)

(52) U.S. Cl.
CPC ...... *G11C 16/0425* (2013.01); *G11C 11/4074* (2013.01); *G11C 11/5628* (2013.01); *G11C 16/0483* (2013.01); *H01L 27/11521* (2013.01); *H01L 29/66825* (2013.01)

(58) Field of Classification Search
CPC ............ G11C 16/0425; G11C 16/0483; G11C 11/4074; G11C 11/5628
USPC ...................................................... 365/185.18
See application file for complete search history.

(56) References Cited

U.S. PATENT DOCUMENTS

| 5,796,139 | A | * | 8/1998 | Fukase | G11C 16/0416 257/315 |
| 5,974,499 | A | * | 10/1999 | Norman | G11C 16/10 711/103 |
| 6,002,152 | A | * | 12/1999 | Guterman | H01L 27/115 257/316 |
| 6,058,043 | A | * | 5/2000 | Houdt | G11C 16/0425 365/185.14 |
| 6,653,682 | B1 | * | 11/2003 | Houdt | G11C 16/0425 257/315 |
| 6,714,454 | B2 | * | 3/2004 | Ma | G11C 16/0458 257/E29.308 |

(Continued)

OTHER PUBLICATIONS

International Search Report and Written Opinion, Application No. PCT/US2019/037437, 14 pages, dated Aug. 28, 2019.

*Primary Examiner* — Sung Il Cho
(74) *Attorney, Agent, or Firm* — Slayden Grubert Beard PLLC

(57) ABSTRACT

Embodiments of the present disclosure provide systems and methods for improving the read window in a split-gate flash memory cell, e.g., by biasing the control gate terminal with a non-zero (positive or negative) voltage during cell read operations to improve or control the erased state read performance or the programmed state read performance of the cell. A method of operating a split-gate flash memory cell may include performing program operations, performing erase operations, and performing read operations in the cell, wherein each read operation includes applying a first non-zero voltage to the word line, applying a second non-zero voltage to the bit line, and applying a third non-zero voltage $V_{CGR}$ to the control gate.

20 Claims, 7 Drawing Sheets

(56) References Cited

U.S. PATENT DOCUMENTS

| | | | | |
|---|---|---|---|---|
| 8,711,636 B2* | 4/2014 | Do | ......................... | G11C 16/26 |
| | | | | 365/185.29 |
| 9,792,995 B1* | 10/2017 | Shah | ...................... | G11C 16/26 |
| 2002/0008277 A1* | 1/2002 | Chen | ................. | H01L 27/11521 |
| | | | | 257/315 |
| 2003/0039146 A1* | 2/2003 | Choi | .................. | G11C 16/0433 |
| | | | | 365/185.33 |
| 2003/0052360 A1* | 3/2003 | Guterman | ............. | H01L 27/115 |
| | | | | 257/315 |
| 2004/0065917 A1* | 4/2004 | Fan | ..................... | H01L 29/7883 |
| | | | | 257/315 |
| 2004/0130947 A1* | 7/2004 | Fan | ..................... | H01L 29/40114 |
| | | | | 365/185.05 |
| 2006/0098505 A1* | 5/2006 | Cho | ................. | G11C 29/50008 |
| | | | | 365/201 |
| 2007/0140003 A1 | 6/2007 | Ido | ............................. | 365/185.2 |
| 2013/0219108 A1* | 8/2013 | Yang | .................... | G06F 11/1068 |
| | | | | 711/103 |
| 2014/0198578 A1 | 7/2014 | Do et al. | .................. | 365/185.18 |
| 2015/0187782 A1* | 7/2015 | Yamakoshi | ............ | G11C 16/10 |
| | | | | 257/321 |
| 2016/0027517 A1* | 1/2016 | Kim | ....................... | G11C 16/14 |
| | | | | 365/185.33 |
| 2016/0064089 A1* | 3/2016 | La Rosa | ............. | H01L 29/7881 |
| | | | | 365/185.12 |
| 2016/0099067 A1* | 4/2016 | Tran | ................... | G11C 16/0425 |
| | | | | 365/185.25 |
| 2017/0012049 A1 | 1/2017 | Yang et al. | .............. | 365/185.21 |
| 2019/0189228 A1* | 6/2019 | Lin | ....................... | G11C 16/10 |

\* cited by examiner

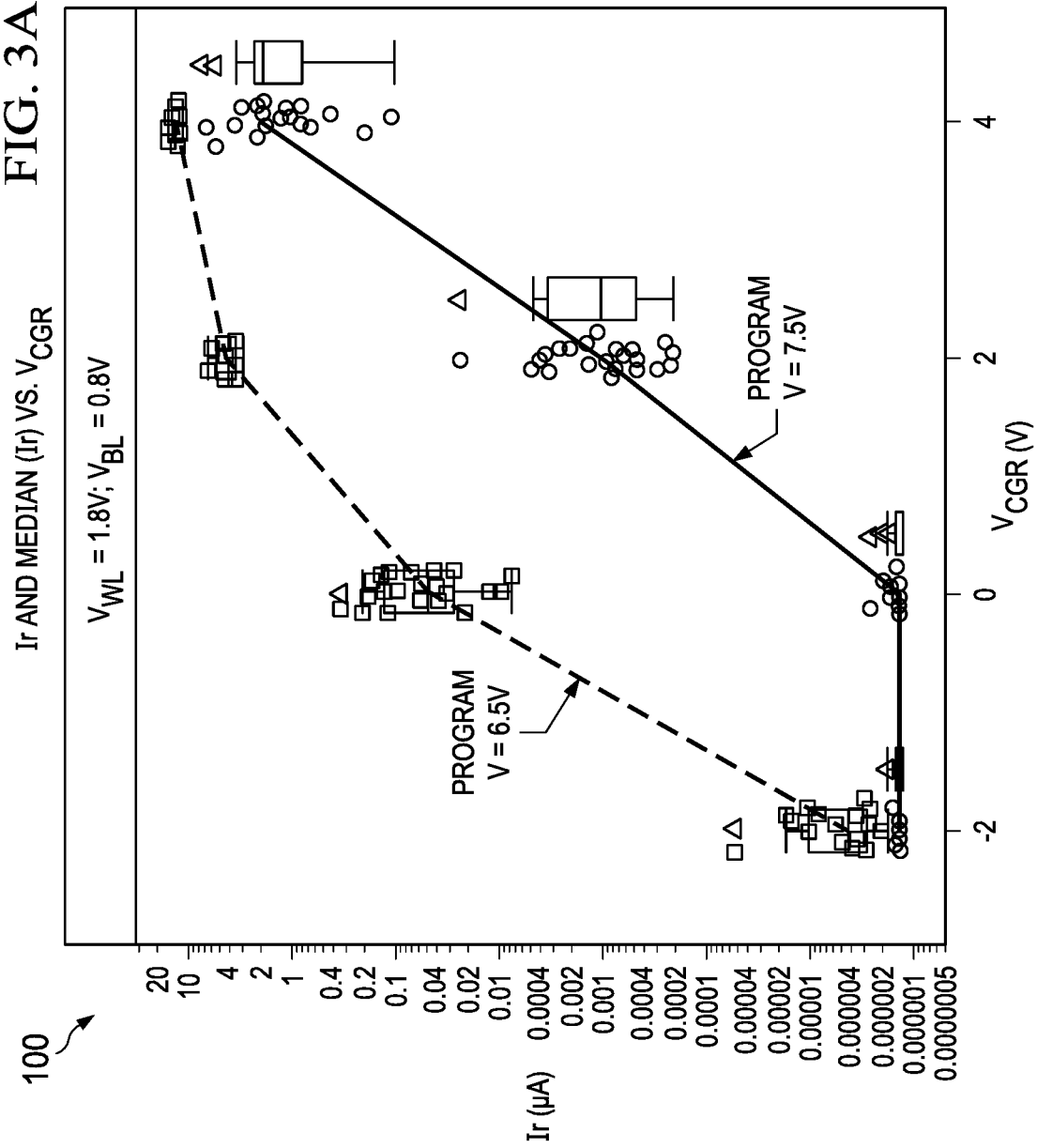

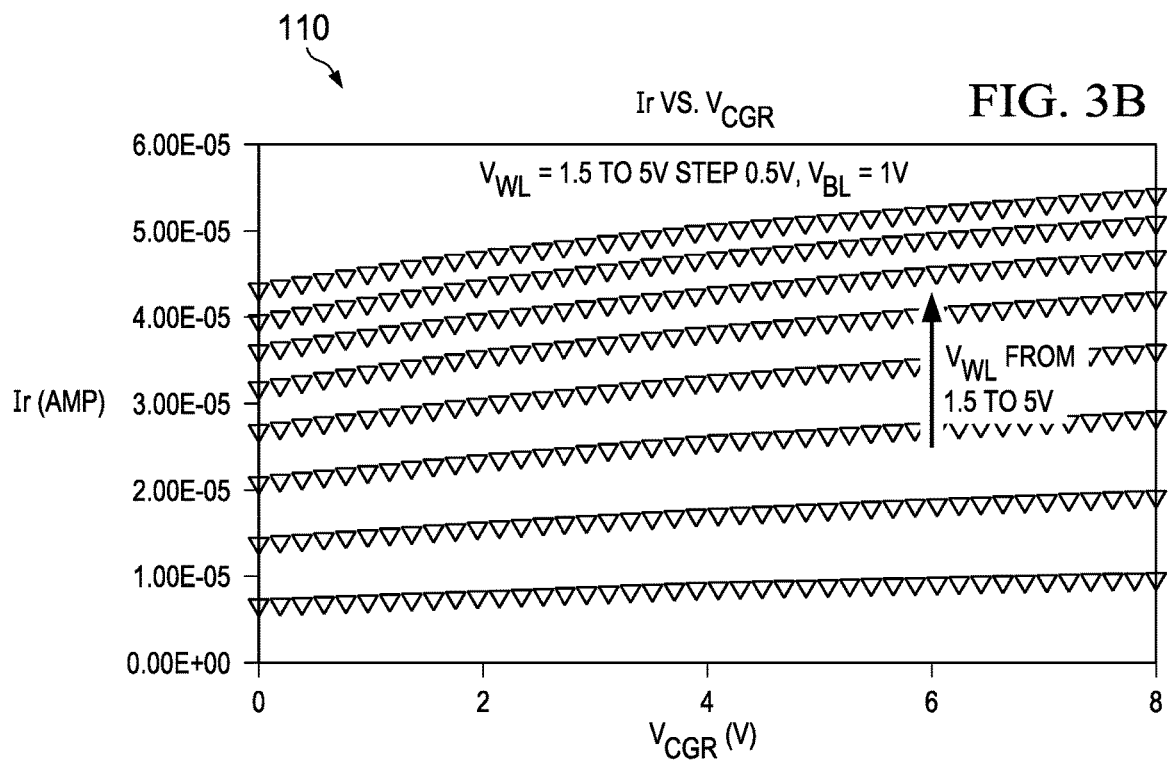
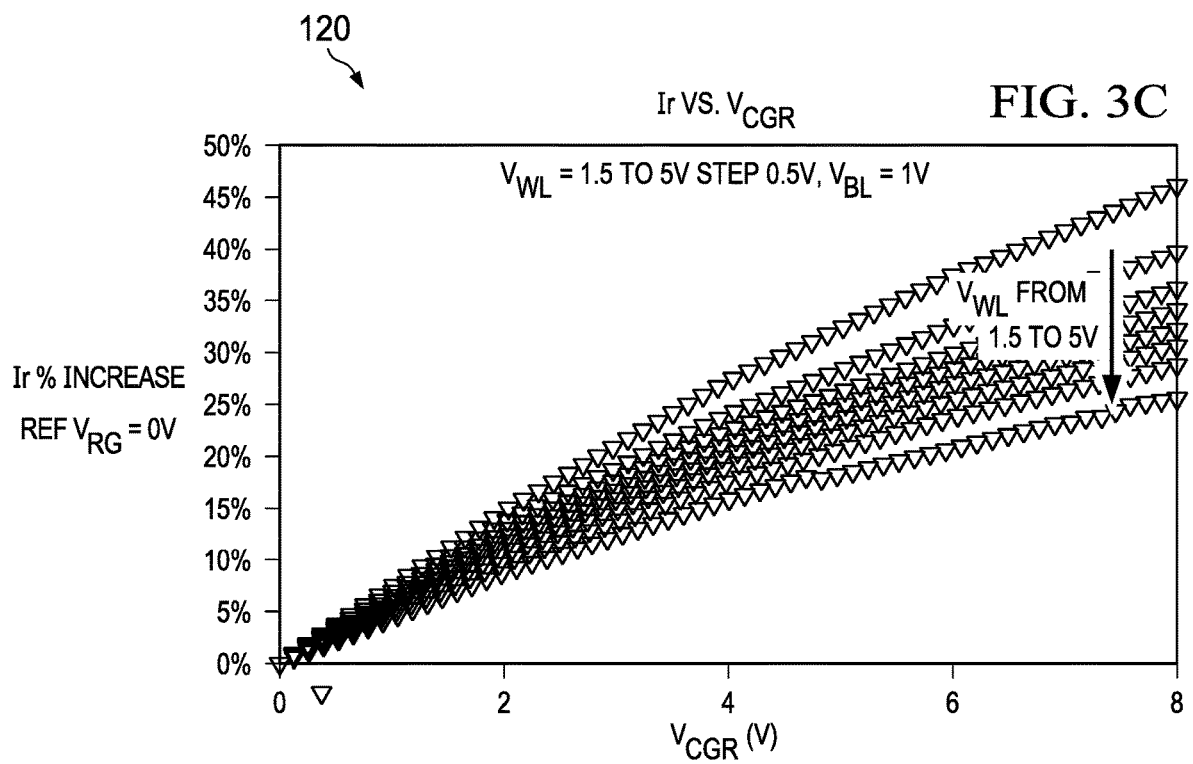

SPLIT-GATE FLASH MEMORY CELL WITH IMPROVED READ PERFORMANCE

TECHNICAL FIELD

The present disclosure relates to split-gate memory cells, and more particularly, to systems and methods for improving the read window in a split-gate flash memory cell, e.g., by biasing the control gate terminal during read operations to improve or control the cell read performance.

BACKGROUND

FIG. 1 illustrates a side cross-sectional view of a known split-gate flash memory cell 10 including a pair of floating gates 12A and 12B formed over a substrate 14, word lines 16A and 16B extending over floating gates 12A and 12B, respectively, and a control gate 20 extending over both floating gates 12A and 12B. An oxide region 18A, 18B is formed over each floating gate 12A and 12B. Word lines 16A and 16B may, for example, represent an odd row word line 16A and an even row word line 16B, or vice versa. A doped source region or junction 24 may be formed in substrate 14 below the control gate 20 and extending partially below each floating gate 12A and 12B, and a pair of doped bit line regions or junctions 24A and 24B may be formed in substrate 20 adjacent word lines 16A and 16B.

Memory cell 10 may also include electrically conductive contact regions in contact with word lines 16A and 16B, control gate 20, source region 24, and bit line regions 24A and 24B, for applying voltages to the various cell components to provide various memory cell functions, e.g., program, erase, and read functions. As shown, these contacts may include word line contacts 30A and 30B, a control gate contact 32, a source contact 34, and bit line contacts 36A and 36B.

In some embodiments, the split-gate flash memory cell 10 is a SuperFlash memory cell (e.g., a SuperFlash ESF1+ cell) by Microchip Technology Inc., having a headquarters at 2355 W Chandler Blvd, Chandler, Ariz. 85224. Thus, in some embodiments, split-gate flash memory cell 10 may comprise a cell as disclosed in U.S. Pat. No. 8,711,636, or a variant thereof.

Split-gate flash memory cell 10 may be programmed and erased by applying defined voltages to one or more of the following: a selected word line contact 30A or 30B ($V_{WL}$), the control gate contact 32 ($V_{CG}$), the source contact 34 ($V_{SL}$), and/or a selected bit line contact 36A or 36B ($V_{BL}$) for a defined time to provide either (a) a cell current Ir0 that corresponds with a programmed state ("off" state) of the cell or (b) a cell current Ir1 that corresponds with an erased state ("on" state) of the cell. In addition, the present programmed/erased status of the cell may be read by applying defined voltages to a selected word line contact 30A or 30B ($V_{WL}$) and the adjacent bit line contact 36A or 36B ($V_{BL}$).

FIG. 2 is a table showing example voltages that may be applied to the various contacts of split-gate flash memory cell 10 to perform program, erase, and read functions, according to a conventional cell operation. As shown, the conventional read function is performed via the word line 16A or 16B and associated bit line 24A or 24B, by applying a defined $V_{WL}$ and $V_{BL}$ to a selected word line contact 30A or 30B and associated bit line contact 36A or 36B, with no voltage applied to the source contact 34 ($V_{SL}=0$) or control gate contact 32 ($V_{CG}=0$).

However, as discussed herein, the inventors have conceived of the idea of applying a selected non-zero voltage (positive or negative) to the control gate contact 32 during read operations, indicated as $V_{CGR}$, to selectively tune the memory cell for improved or controlled read performance.

SUMMARY

Embodiments of the present disclosure provide systems and methods for improving the read window in a split-gate flash memory cell, e.g., by biasing the control gate terminal with a non-zero (positive or negative) voltage during cell read operations to improve or control the erased state read performance or the programmed state read performance of the cell.

For example, a non-zero negative voltage $V_{CGR}$ may be applied to the control gate to improve the programmed state read performance of the cell, at the possible expense of the erased state read performance. Similarly, a non-zero positive voltage $V_{CGR}$ may be applied to the control gate to improve the erased state read performance of the cell, at the possible expense of the programmed state read performance. In view of these performance trade-offs, the $V_{CGR}$ for any particular memory cell may be set based on the intended usage and/or performance characteristics of that memory cell, e.g., such as endurance, read speed, etc.

For example, for memory cells in which erased state read performance is particularly important, $V_{CGR}$ may be set to a positive value. For example, for memory cells used in high-cycle/high endurance target applications, $V_{CGR}$ may be set to a positive value to improve long-term/high-cycle erase read performance, based on the knowledge that erase performance typically degrades faster or to a greater degree than program performance. Alternatively, for memory cells in which programmed state read performance is particularly important, or for memory cells that may be marginally or poorly programmed, $V_{CGR}$ may be set to a negative value. In addition, different $V_{CGR}$ values may also be used for read operations via the even row WL and read operations via the odd row WL, e.g., to compensate for asymmetry created during the formation of the cell, for example based on the respective overlap (x- or y-direction) between either the word lines 16A, 16B or the control gate 20 over the floating gates 12A and 12B (see FIG. 1 for reference).

Some embodiments provide a device that includes multiple flash memory cells having different measured programmed and/or erased state current values, wherein different $V_{CGR}$ values are set (e.g., stored in respective trim bits) and applied for different flash memory cells in the device.

BRIEF DESCRIPTION OF THE DRAWINGS

Example aspects of the present disclosure are described below in conjunction with the figures, in which:

FIG. 3A is a graph illustrating example effects of applying a control gate voltage $V_C$ when performing a programmed state (off state) read operation on an example split-gate flash memory cell, according to one embodiment.

FIGS. 3B and 3C are graphs illustrating example effects of applying a control gate voltage $V_C$ when performing an erased state (on state) read operation on an example split-gate flash memory cell, according to one embodiment.

DETAILED DESCRIPTION

Embodiments of the present disclosure provide systems and methods for improving the read window in a split-gate flash memory cell, e.g., by biasing the control gate terminal during read operations to improve or control the cell read performance, e.g., by improving the erased state read performance or programmed state read performance of the cell.

Figure 1:
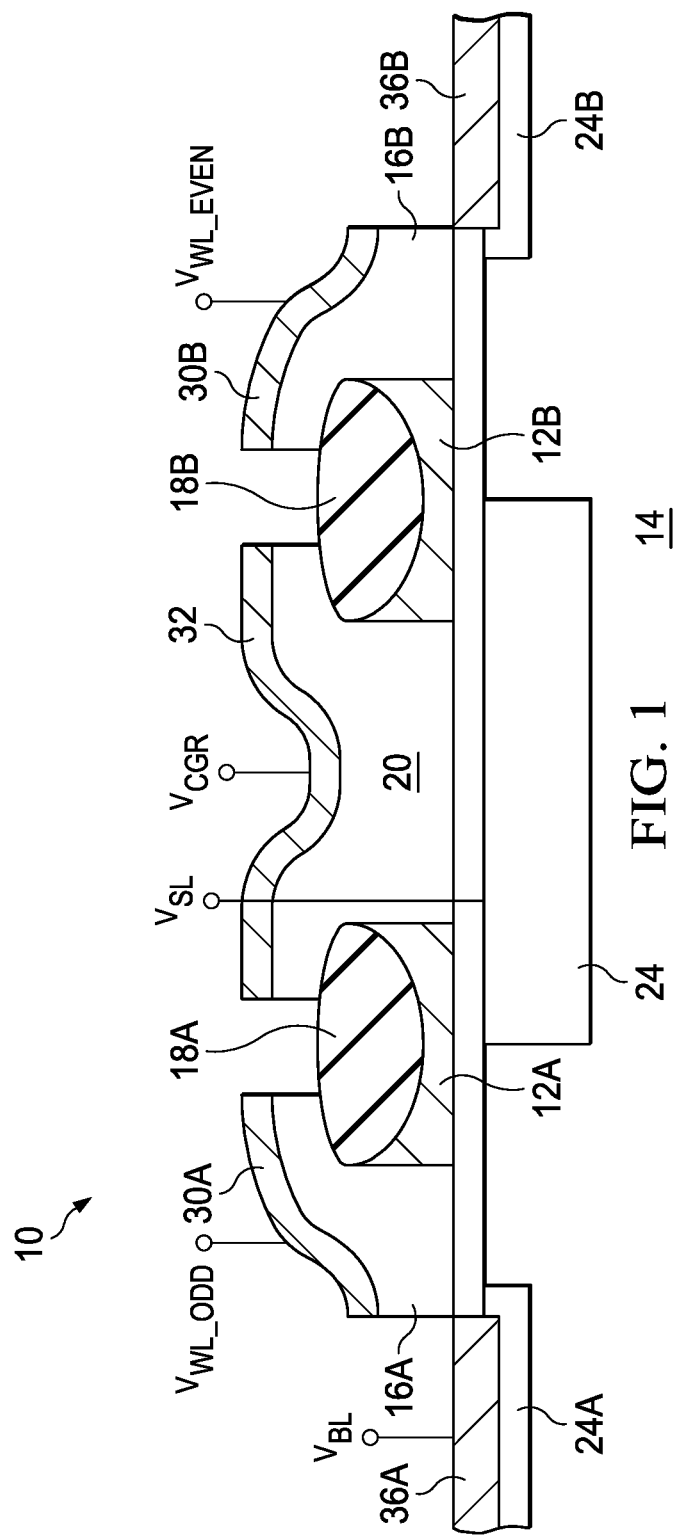
FIG. 1 illustrates a side cross-sectional view of a split-gate flash memory cell including a pair of floating gates, a word line extending over each floating gate, and a control gate extending over both floating gates.

FIG. 3A is a data plot 100 illustrating example effects of biasing the control gate 20 by a control gate voltage $V_{CGR}$ when performing a programmed state (off state) read operation on the example split-gate flash memory cell 10 shown in FIG. 1. Plot 100 shows the sensed cell off state current (Ir0, in μA) as a function of $V_{CGR}$ applied during a programmed state read operation, for reads at both a well programmed cell (program voltage=7.5V) and a marginally programmed cell (program voltage=6.5V).

As known in the art, programmed state read performance improves with lower sensed off state current (Ir0). Thus, FIG. 3 shows that as control gate voltage $V_{CGR}$ is decreased and made negative, the sensed off state current Ir0 decreases, resulting in improved programmed state read operations. In addition, as discussed below with reference to FIG. 5, using a negative $V_{CGR}$ may also reduce an asymmetry between even WL row read operations and odd WL row read operations, which is common in split-gate flash memory cells due to manufacturing tolerances or imperfections, especially on marginally programmed cells. Thus, a negative $V_{CGR}$ may be beneficial for improved programmed state read Ir0 margin. In essence, application of the negative $V_{CGR}$ causes the cell to appear to be well programmed, even when it is not.

FIGS. 3B and 3C are data plots illustrating example effects of applying a control gate voltage $V_{CGR}$ during an erased state (on state) read operation on an example split-gate flash memory cell, according to one embodiment. In particular, plot 110 shown in FIG. 3B shows the sensed on-state current Ir1 as a function of control gate voltage $V_{CGR}$ and as a function of word line voltage $V_{WL}$, and plot 120 shown in FIG. 3C shows the percentage increase in sensed on-state current Ir1 as a function of control gate voltage $V_{CGR}$ and as a function of word line voltage $V_{WL}$.

As known in the art, erased state read performance improves with increased sensed on-state current (Ir1). FIGS. 3B and 3C show that as $V_{CGR}$ is increased (positive value), the sensed Ir1 increases, thus improving the on-state (erased state) read margin. The Ir1 increase, and thus on-state read improvement, may be dependent on the coupling ratio between the control gate 20 and the relevant floating gate 12A or 12B, which is typically a function of the inter-poly oxide thickness. FIGS. 3B and 3C also show that by increasing the $V_{CGR}$ applied during on-state read operations, the word line voltage $V_{WL}$ may be decreased while still providing the same or greater sensed on-state current Ir1 than provided by a conventional read operation with $V_{CGR}=0$.

Figure 4A:
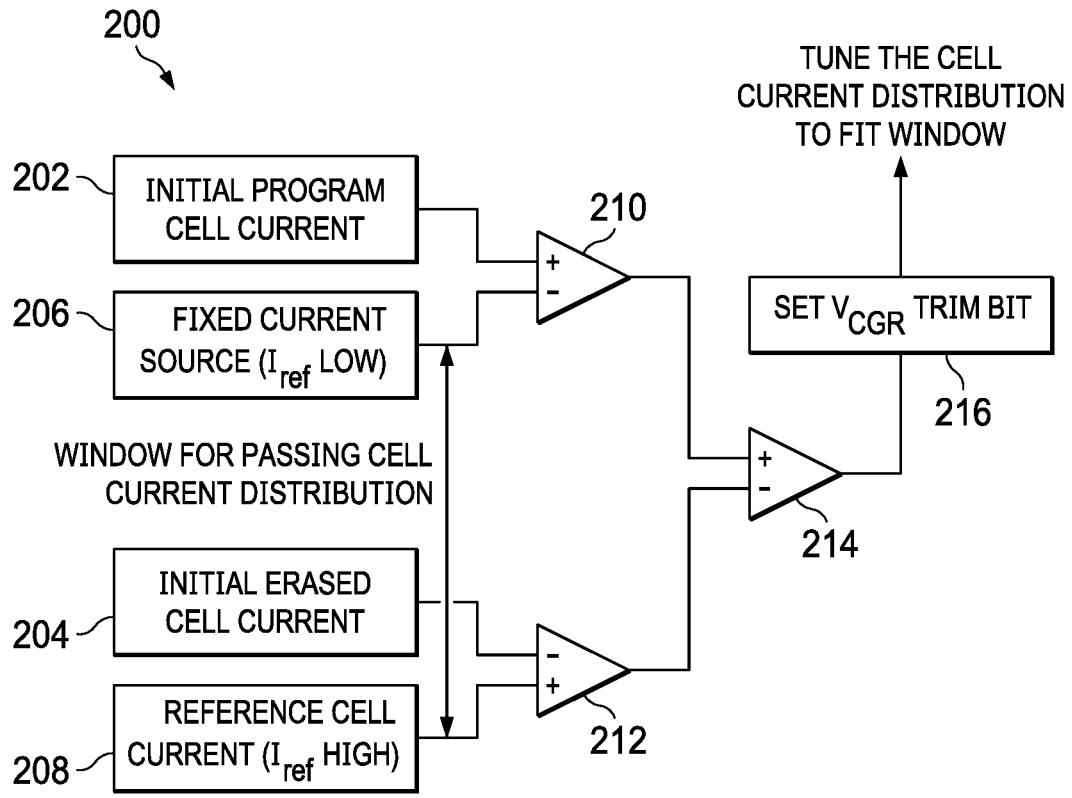
FIG. 4A illustrates an example method or algorithm for determining a control gate voltage $V_{CGR}$ to apply to a fabricated memory cell as a function of an initial program current and/or erase current of the cell as fabricated, e.g., as determined in a sort test, according to one embodiment of the invention.

FIG. 4A illustrates an example method or algorithm 200 for determining a control gate voltage $V_{CGR}$ to apply to a fabricated memory cell, by setting a $V_{CGR}$ trim bit, as a function of a measured program current and/or erase current of the cell, according to one embodiment of the invention. In this embodiment, the initial program current and erase current of the cell may be measured after fabrication, e.g., during a sort test. A fixed current source ($I_{ref}$ low) and a reference cell current ($I_{ref}$ high) may define a window (e.g., on-state current on vs. off-state current) for passing cell current distribution. In the example algorithm 200, an initial programmed state current of the cell is measured at 202, and an initial erased state current of the cell is measured at 204. The initial programmed state cell current is compared with a fixed current source ($I_{ref\_low}$) 206 using an analog comparator at 210, and the initial erased state cell current is compared with a reference cell current ($I_{ref\_high}$) 208 using an analog comparator at 212. The comparators 210 and 212 on both the erased and the programmed side are then used to adjust the $V_{CGR}$ programmable value at 214, and a corresponding trim bit value is set at 216. For example, the comparator 210 on the programmed state would have an output logic 1 (high) if the initial programmed state current 202 is higher than the fixed reference current 206. This output may then drive the downstream comparator 214 to an output state of 1 that would force the $V_{CGR}$ trim bit to program the $V_{CGR}$ voltage to a more negative value (e.g., using an iterative approach with incremental/stepped changes to the $V_{CGR}$ value) until the output of the programmed state comparator 210 flips to a logic 0 (low) state, and this $V_{CGR}$ value (or the $V_{CGR}$ value prior to the 1→0 flip of comparator 210 output) may be set as the $V_{CGR}$ trim bit.

Thus, algorithm 200 may calculate or determine a $V_{CGR}$ value to "shift" the on/off current window to optimize the read performance as desired, and this $V_{CGR}$ value may be set as a $V_{CGR}$ trim bit in the flash memory (e.g., using a fuse bit). For example, setting the $V_{CGR}$ trim bit to a negative value (e.g., −2V) may reduce both the sensed programmed state current Ir0 and the erased state current Ir1. Thus, setting the $V_{CGR}$ trim bit to a negative value may improve programmed state read performance at the possible expense of erased state read performance. Similarly, setting the $V_{CGR}$ trim bit to a positive value (e.g., 6V) may increase both the sensed programmed state current Ir0 and the erased state current Ir1. Thus, setting the $V_{CGR}$ trim bit to a positive value may improve erased state read performance at the possible expense of programmed state read performance.

In view of the trade-offs discussed above, the $V_{CGR}$ for any particular memory cell may be set based on the intended usage and/or performance characteristics of that memory cell, e.g., such as endurance, read speed, etc.

For example, for memory cells in which erased state read performance is particularly important, $V_{CGR}$ may be set to a positive value. For example, for memory cells used in high-cycle/high endurance target applications, $V_{CGR}$ may be set to a positive value to improve long-term/high-cycle erase read performance, based on the knowledge that erase performance typically degrades faster or to a greater degree than program performance.

Alternatively, for memory cells in which programmed state read performance is particularly important, or for memory cells that may be marginally or poorly programmed, $V_{CGR}$ may be set to a negative value.

In one embodiment, a device may include multiple flash memory cells having different measured programmed and/or erased state current values, such that different $V_{CGR}$ values may be set (e.g., stored in respective trim bits) for different flash memory cells in the device.

Figure 4B:
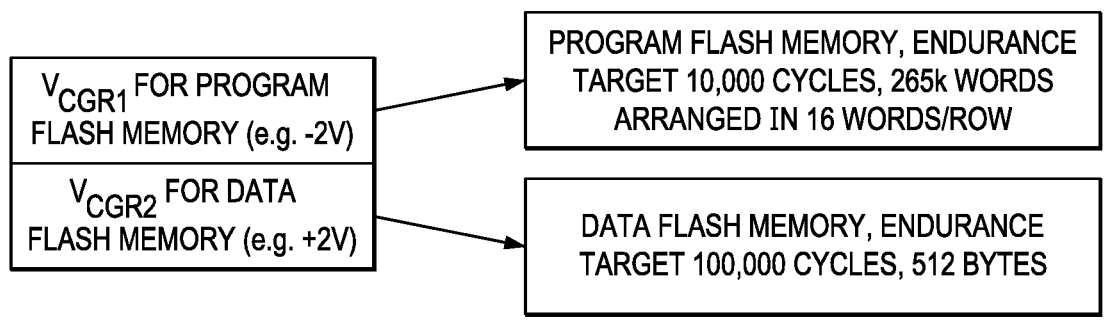
FIG. 4B illustrates the application of different control gate voltages $V_{CGR}$ for read operations on different types of memory cells, e.g., program flash memory cells and data flash memory cells, according to one embodiment of the invention.

FIG. 4B illustrates the application of different control gate voltages $V_C$ for read operations on different types of memory cells, e.g., program flash memory cells and data flash memory cells, according to one embodiment of the invention. Program flash memory typically has a lower endurance specification than data flash memory. Due to larger size and construction, program flash memory is typically more prone to certain disturb mechanisms such as a column disturb. These disturb mechanisms can be reduced by lowering the off state current (Ir0) at the expense of on-state current (Ir1). As discussed above, endurance degradation in the cell occurs mostly in the on-state current Ir1, so a lower initial (pre-endurance) Ir1 may be tolerated by using a negative $V_{CGR}$.

In contrast, for the data flash memory, the panel is typically much smaller but has a higher endurance specification. Because the endurance degradation occurs mainly in the on-state current Ir1, $V_{CGR}$ may be set to a positive value to obtain a higher sensed Ir1, to thereby compensate for the endurance-related erase degradation.

Thus, the $V_{CGR}$ for each flash memory cell may be set based on the intended usage of that cell. In one embodiment, a device may include multiple types of flash memory (e.g., program flash and data flash) having different $V_{CGR}$ settings (e.g., as stored in respective trim bits).

As discussed above, in some embodiments, applying a non-zero $V_{CGR}$ may reduce a cell read current asymmetry between even and odd cells, e.g., even and odd word lines/rows that share a common control gate. This asymmetry is common in split-gate flash memory cells due to manufacturing tolerances or imperfections (e.g., regarding the extent of overlap between the word lines and/or control gate over each floating gate), especially on marginally programmed cells. For example, odd/even row asymmetry may be created during the formation of the cell, based on the respective overlap (x- or y-direction) between either the word lines 16A, 16B or the control gate 20 over the floating gates 12A and 12B (see FIG. 1 for reference). A misalignment during fabrication could cause a large x-direction overlap for the even row as compared with the odd row, or vice versa. This overlap asymmetry may result in a different erase or program performance for the cell as compared to a neighboring cell(s) that share the same source junction. The $V_{CGR}$ for the even and/or odd rows may be tuned to compensate for this asymmetry.

In some embodiments, a control system may be configured to apply a non-zero $V_{CGR}$ for cell reads via both the odd and even row WLs. For example, the control system may be configured to apply the same non-zero $V_{CGR}$ (either a positive or negative value $V_{CGR}$) for reads via both the odd and even WLs. As another example, the control system may be configured to apply a first non-zero $V_{CGR1}$ (either a positive or negative value $V_{CGR}$) for reads via the odd row WL, and a second, different non-zero $V_{CGR2}$ (with either the same or opposite polarity) for reads via the even row WL.

Figure 5:
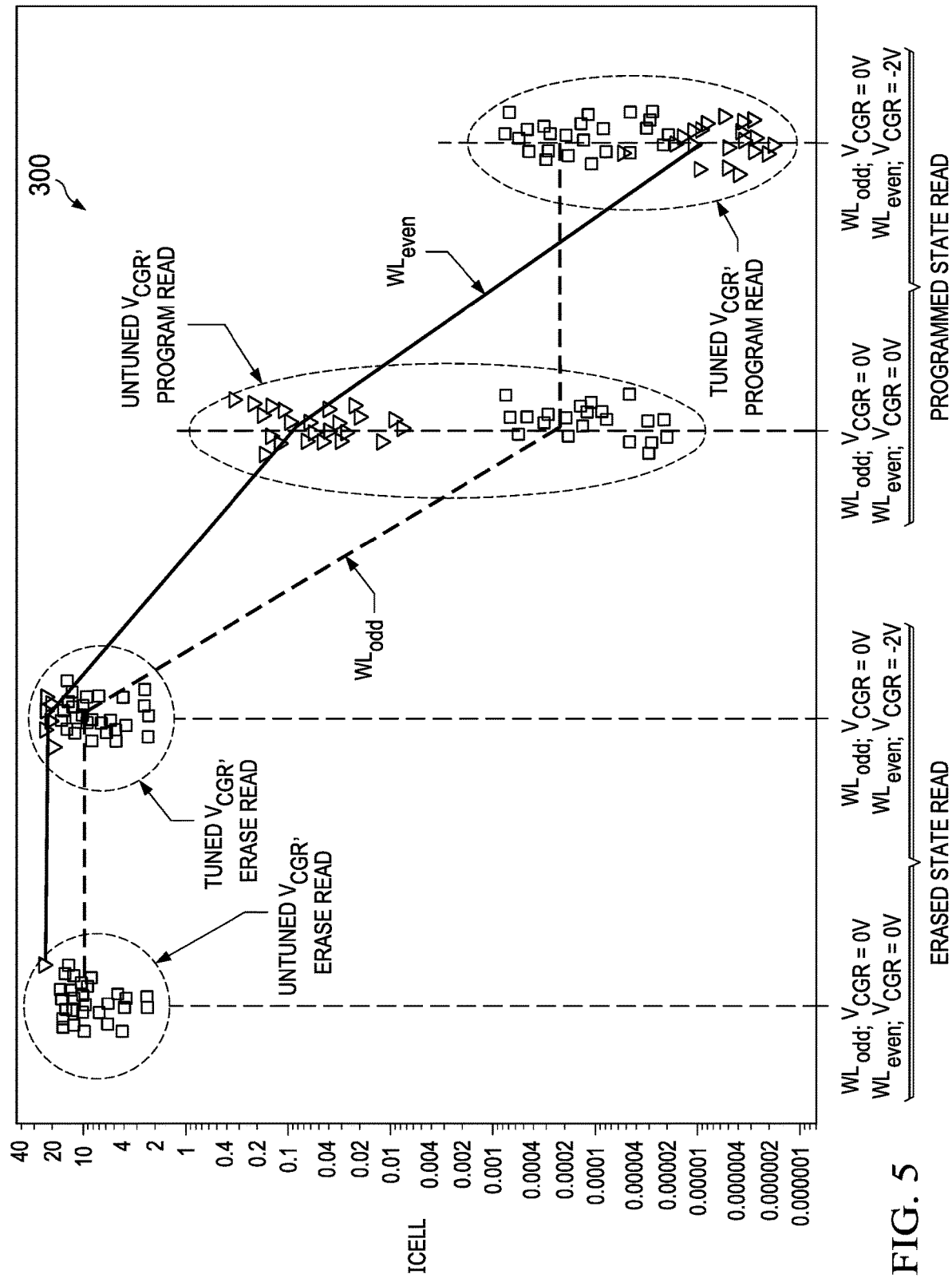
FIG. 5 illustrates the ability to compensate for asymmetry in the programmed cell read performance between the even and odd cells (e.g., even and odd word lines) by tuning the control gate read voltage $V_{CGR}$ to different values for reads via the even cell versus reads via the odd cell.

FIG. 5 is a plot 300 showing example cell current data for an example memory cell in which $V_{CGR}=-2V$ is applied for reads via the even row WL and no control gate voltage is applied ($V_{CGR}=0V$) for reads via the odd row WL, for both erase state and programmed state reads, as indicated in the data clusters labelled "Tuned $V_{CGR}$, erase read" and "Tuned $V_{CGR}$, programmed read." Plot 300 also shows example cell current data for the same memory cell in which no control gate voltage is applied ($V_{CGR}=0V$) for reads via both the odd and even WL rows, as indicated in the data clusters labelled "Untuned $V_{CGR}$, erase read" and "Untuned $V_{CGR}$, programmed read."

As shown in FIG. 5, applying $V_{CGR}=-2V$ for reads via the even row WL may reduce the asymmetry (e.g., difference in average sensed cell current) between the odd and even rows for programmed state reads, as compared with the situation of applying no control gate voltage ($V_{CGR}=0V$).

Figure 6:
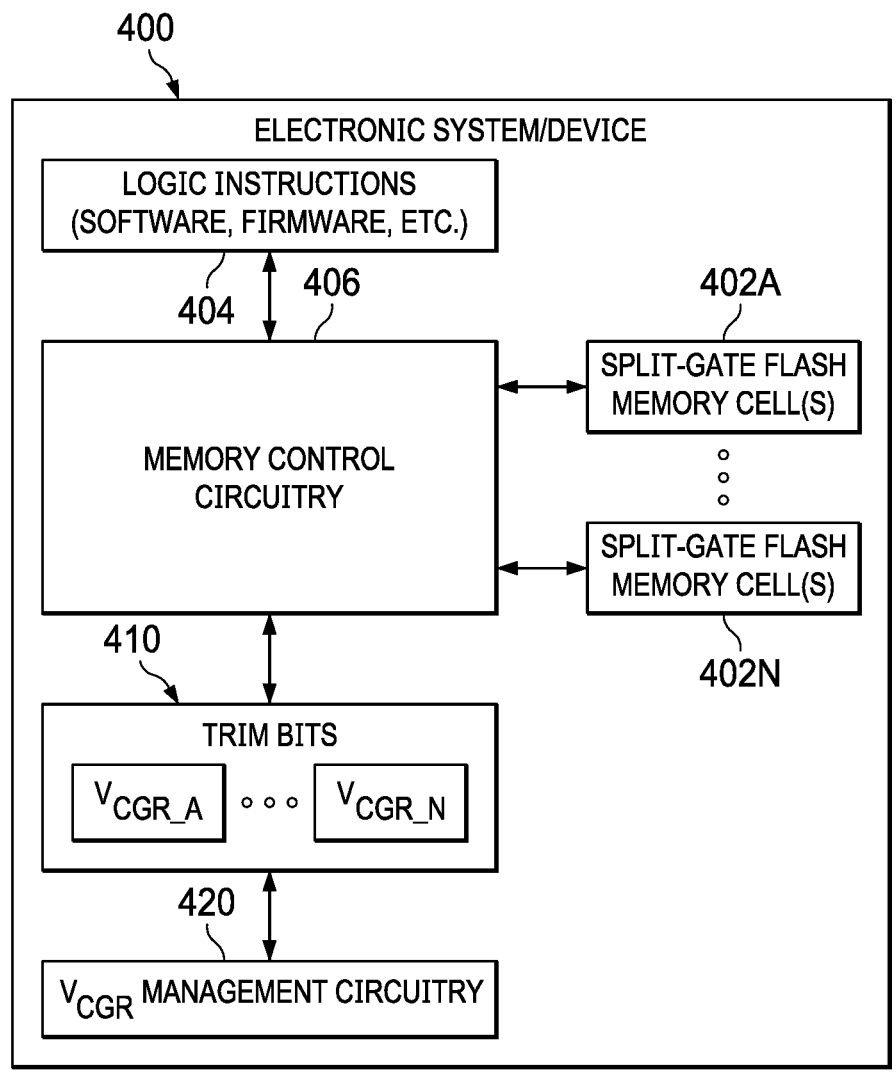
FIG. 6 illustrates an example system or device including a plurality of flash memory cells having a control gate, and control electronics configured to apply a non-zero voltage bias to the control gate during read operations of the flash memory cells, according to an example embodiment.

FIG. 6 illustrates an example electronic system or device 400, according to an example embodiment. Electronic system or device 400 may include groups or arrays of flash memory cells 402 (indicated at 402A-402N as discussed below), logic instructions (e.g., embodied as software or firmware), control circuitry 406 for operating flash memory cells 402 (e.g., by performing program, erase, and read operations), and any other suitable hardware, software, or firmware for providing the functionality of the respective electronic system or device 400.

Control circuitry 406 may be configured to apply a non-zero (positive or negative) voltage bias to the control gate, $V_{CGR}$, during read operations of respective flash memory cells 402, for reads via one or both of the odd and even row WLs, e.g., to improve programmed state read performance or erased state read performance of the respective flash memory cells 402, as discussed above. The control gate read voltage(s), $V_{CGR}$, applied to respective flash memory cells 402 may be stored in memory as trim bits 410 accessible to memory control circuitry 406.

In some embodiments, the control circuitry 406 may be configured to apply a different $V_{CGR}$ for reads via the odd row WL as compared with the even row WL, e.g., as discussed above regarding FIG. 5. For example, control circuitry 406 may determine or control whether each respective read access is being made to an even row or an odd row, and control a voltage source driving the control gate accordingly. For example, a simple register bit that is ANDED with a non-zero $V_{CGR\ drive}$ (e.g., $V_{CGR}=-2V$) can indicate an even bit if the bit is 1, and 0V when the bit is 0. The control circuitry 406 may determine whether each read access is for an even or odd row using any technique known in the art, e.g., by multiplexing with the memory address counter last (least significant or LSB) bit, or other suitable technique.

Figure 2:
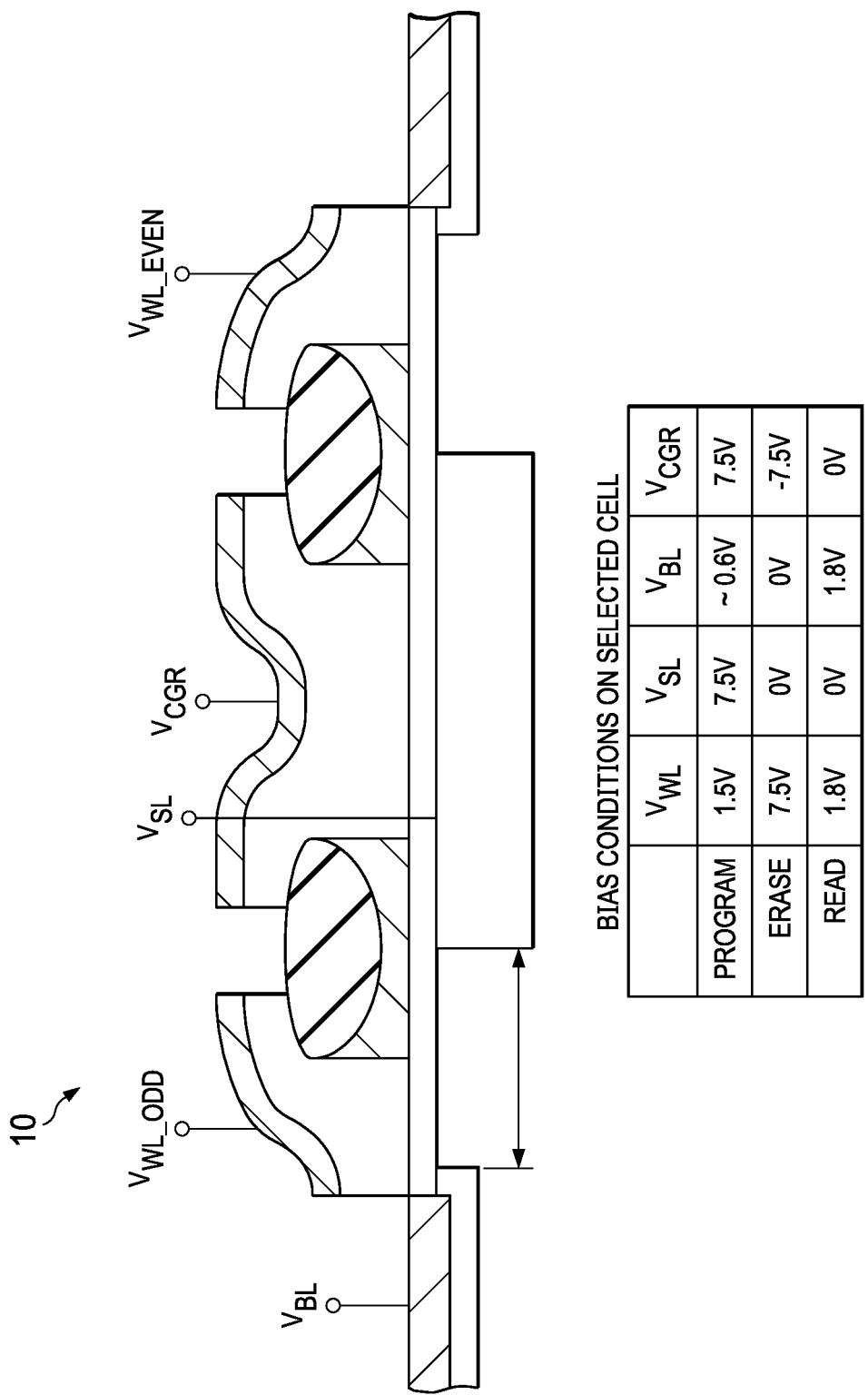
FIG. 2 is a table showing example voltages that may be applied to the various contacts of the split-gate flash memory cell of FIG. 1 to perform program, erase, and read operations, according to a conventional cell operation.

In the illustrated example, flash memory 402 may include multiple different groups or arrays of flash memory cells 402A-402N, where each group may include one or more flash memory cell, e.g., split-gate flash memory cells such as shown in FIGS. 1-2 and discussed above. In one example embodiment, flash memory cells 402A-402N may include SuperFlash memory cell (e.g., SuperFlash ESF1+ cells or a variation thereof) by Microchip Technology Inc., having a headquarters at 2355 W Chandler Blvd, Chandler, Ariz. 85224.

In some embodiments, the different groups or arrays of flash memory cells 402A-402N may have different usage characteristics or requirements (e.g., different endurance, read speed, or other usage requirements), different performance characteristics, different physical specifications, or may represent different batches of memory cells fabricated at different times or using different fabrication parameters, for example. Thus, to compensate for such differences, or to achieve performance characteristics for different memory cell groups 402A-402N, control circuitry 406 may apply a selected control gate read voltage $V_{CGR}$ (or selected $V_{CGR}$ values specific to odd row reads or even row reads) to each respective memory cell group 402A-402N. Thus, as shown in FIG. 6, respective control gate read voltage value(s) $V_{CGR\_A}$-$V_{CGR\_N}$ may be stored for each respective flash memory cell group 402A-402N, e.g., as trim bits 410 stored in device memory. Control gate read voltage values $V_{CGR\_A}$-$V_{CGR\_N}$ may include any number of different voltage values, may include both negative and positive voltage values, and may also include at least one zero value. In other embodiments, a single control gate read voltage value $V_{CGR}$ is used for all flash memory cells 402 in the device.

In some embodiments, device 400 may include control gate voltage management circuitry 420 configured to set and/or dynamically adjust the values of one or more control gate read voltage values $V_{CGR\_A}$-$V_{CGR\_N}$. For example, control gate voltage management circuitry 420 may be configured to execute method 200 shown in FIG. 4A to measure initial program/erase current values for each (or selected) memory cells and set respective value(s) $V_{CGR}$ based on such measurements and/or additional factors (e.g., the usage characteristics or requirements, performance characteristics, physical specifications, etc. of the respective memory cells) for one or more respective memory cell groups 402A-402N. Further, in one embodiment, control gate voltage management circuitry 420 may be configured to dynamically adjust the control gate read voltage value $V_{CGR}$ for at least one memory cell group 402A-402N over time, e.g., based on monitored endurance data for respective memory cells (e.g., using an erase cycle counter), or based on periodic program/erase current measurements taken by circuitry 420.

The invention claimed is:

1. A method of operating a flash memory cell including a floating gate, a source region, a word line, a bit line, and a control gate, the method comprising:
   measuring at least one of a programmed (off state) cell current or an erased (on state) cell current of the memory cell; and
   selecting a non-zero control gate voltage $V_{CGR}$ based at least on the measured programmed (off state) cell current and/or erased (on state) cell current;
   performing program operations in the memory cell;
   performing erase operations in the memory cell; and
   performing read operations in the memory cell, including applying the non-zero control gate voltage $V_{CGR}$ to the control gate during each read operation wherein applying the selected non-zero control gate voltage $V_{CGR}$ either (a) increases a programmed (off state) read current margin while decreasing an erased (on state) read current margin or (b) increases the erased (on state) read current margin while decreasing the programmed (off state) read current margin, as compared to applying $V_{CGR}=0$ during each read operation.

2. The method of claim 1, wherein the flash memory cell comprises a split-gate flash memory cell including a pair of floating gates, a respective word line formed over each respective floating gate, and a single control gate extending over both floating gates.

3. The method of claim 2, wherein the split-gate flash memory cell comprises a SuperFlash ESF1+ cell.

4. The method of claim 1, wherein selecting and applying a non-zero control gate voltage $V_{CGR}$ comprises selecting and applying a negative voltage ($V_{CGR}<0$) to the control gate during each read operation.

5. The method of claim 4, comprising applying a negative voltage of −1V or less ($V_{CGR}\leq0$) to the control gate during each read operation.

6. The method of claim 1, wherein selecting and applying a non-zero control gate voltage $V_{CGR}$ comprises selecting and applying a positive voltage ($V_{CGR}>0$) to the control gate during each read operation.

7. The method of claim 6, comprising applying a positive voltage of at least 1V ($V_{CGR}\geq0$) to the control gate during each read operation.

8. The method of claim 1, wherein the non-zero voltage $V_{CGR}$ applied to the control gate during each read operation alters a sensed cell current (Ir0 or Ir1), as compared to applying $V_{CGR}=0$ during each read operation.

9. The method of claim 1, comprising selecting the non-zero control gate voltage $V_{CGR}$ using a trim bit.

10. The method of claim 1, wherein measuring at least one of a programmed (off state) cell current or an erased (on state) cell current of the memory cell comprises measuring at least one of an initial programmed (off state) cell current or an initial erased (on state) cell current of the memory cell after fabrication of the memory cell.

11. The method of claim 1, comprising:
    selecting the initial non-zero value of the control gate voltage $V_{CGR}$; and
    dynamically adjusting the non-zero value of the control gate voltage $V_{CGR}$ over time.

12. The method of claim 1, wherein performing each read operation includes:
    applying a first non-zero voltage to the word line;
    applying a second non-zero voltage to the bit line; and
    applying the non-zero voltage $V_{CGR}$ to the control gate.

13. The method of claim 12, wherein the second non-zero voltage to the bit line is the same voltage as the first non-zero voltage applied to the word line.

14. A method of operating a flash memory cell including at least one floating gate, at least one source region, an even word line, an odd word line, and a control gate, the method comprising:
    performing program operations in the memory cell;
    performing erase operations in the memory cell; and
    performing read operations via the even word line, including applying a first control gate voltage $V_{CGR\_EVEN}$ to the control gate during each read operation via the even word line; and
    performing read operations via the odd word line, including applying a second control gate voltage $V_{CGR\_ODD}$, having a different value than the first control gate voltage $V_{CGR\_EVEN}$, to the control gate during each read operation via the odd word line;
    wherein at least one of the first control gate voltage $V_{CGR\_EVEN}$ and the second control gate voltage $V_{CGR\_ODD}$ is a non-zero voltage.

15. The method of claim 14, wherein both $V_{CGR\_EVEN}$ and $V_{CGR\_ODD}$ are non-zero voltages.

16. The method of claim 14, wherein one of $V_{CGR\_EVEN}$ and $V_{CGR\_ODD}$ is 0V, such that no voltage is applied to the control gate either during read operations via the even word line or during read operations via the odd word line.

17. A device, comprising:
    a plurality of flash memory cells, each including a floating gate, a source region, a word line, a bit line, and a control gate; and control circuitry configured to:
    measure at least one of a programmed (off state) cell current or an erased (on state) cell current of the memory cell; and
    select a non-zero control gate voltage $V_{CGR}$ based at least on the measured programmed (off state) cell current and/or erased (on state) cell current;
    perform program operations in each flash memory cell;
    perform erase operations in each flash memory cell; and
    perform read operations in each flash memory cell, wherein the control circuitry is configured to apply the non-zero control gate voltage $V_{CGR}$ to a respective control gate during each read operation, wherein applying the selected non-zero control gate voltage $V_{CGR}$ either (a) increases a programmed (off state) read current margin while decreasing an erased (on state) read current margin or (b) increases the erased (on state) read current margin while decreasing the programmed (off state) read current margin, as compared to applying $V_{CGR}=0$ during each read operation.

18. The device of claim 17, comprising control gate voltage $V_{CGR}$ values stored in memory for the plurality of flash memory cells.

19. The device of claim 18, wherein different control gate voltage $V_{CGR}$ values are stored for different ones of the plurality of flash memory cells.

20. The device of claim 17, wherein:
each memory cell includes an even word line and an odd word line, and
the control circuitry is configured to:
    determine whether each the read operation is associated with the even word line or the odd word line;
    for each read operation associated with the even word line, applying a first control gate voltage $V_{CGR\_EVEN}$ to the control gate during the respective read operation; and
    for each read operation associated with the odd word line, applying a second control gate voltage $V_{CGR\_ODD}$, having a different value than the first control gate voltage $V_{CGR\_EVEN}$, to the control gate during the respective read operation;
    wherein at least one of the first control gate voltage $V_{CGR\_EVEN}$ and the second control gate voltage $V_{CGR\_ODD}$ is a non-zero voltage.

\* \* \* \* \*